United States Patent
Tsuruda (10) Patent No.: US 6,577,534 B2
(45) Date of Patent: Jun. 10, 2003

(54) NON-VOLATILE SEMICONDUCTOR MEMORY DEVICE HAVING A LOW DEFECTIVE RATE

(75) Inventor: Takahiro Tsuruda, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 43 days.

(21) Appl. No.: 09/767,694

(22) Filed: Jan. 24, 2001

(65) Prior Publication Data

US 2002/0024843 A1 Feb. 28, 2002

(30) Foreign Application Priority Data

Aug. 22, 2000 (JP) ......................................... 2000-250886

(51) Int. Cl.⁷ .............................................. G11C 16/06
(52) U.S. Cl. .............................. 365/185.09; 365/185.2; 365/200; 365/210; 365/230.06
(58) Field of Search .................... 365/185.09, 185.2, 365/200, 210, 230.06

(56) References Cited

U.S. PATENT DOCUMENTS

| | | | |
|---|---|---|---|
| 5,349,558 A | | 9/1994 | Cleveland et al. |
| 5,544,106 A | * | 8/1996 | Koike .......................... 365/200 |
| 5,586,075 A | * | 12/1996 | Miwa ..................... 365/185.29 |
| 5,841,708 A | * | 11/1998 | Nagata ........................ 365/200 |
| 5,943,283 A | | 8/1999 | Wong et al. ............ 365/230.01 |
| 6,335,886 B1 | * | 1/2002 | Ochi et al. ................... 365/200 |
| 6,349,064 B1 | * | 2/2002 | Nakaoka ...................... 365/200 |

FOREIGN PATENT DOCUMENTS

| | | |
|---|---|---|
| JP | 1995-0006873 | 3/1995 |
| JP | 11-144493 | 5/1999 |
| JP | 2000-195300 | 7/2000 |

* cited by examiner

*Primary Examiner*—David Nelms
*Assistant Examiner*—Connie C. Yoha
(74) *Attorney, Agent, or Firm*—McDermott, Will & Emery (57) ABSTRACT

The present invention provides a non-volatile semiconductor memory device including a sector selecting circuit. When a non-defective sector is designated by an address signal, a spare decoder outputs a signal such that a NAND gate can select the non-defective sector, when a defective sector is designated by the address signal, the spare decoder outputs a signal for activating an alternate non-defective sector, and when the alternate non-defective sector is designated by the address signal, a signal for making all of a plurality of sectors non-selective. As a result, it is possible to reduce a defective rate of the non-volatile semiconductor memory device.

7 Claims, 10 Drawing Sheets

NON-VOLATILE SEMICONDUCTOR MEMORY DEVICE HAVING A LOW DEFECTIVE RATE

BACKGROUND OF THE INVENTION

1. Field of the Invention

The present invention relates to a non-volatile semiconductor memory device, and in particular, to a non-volatile semiconductor memory device which has a high access rate to a non-defective sector.

2. Description of the Related Art

Figure 7:
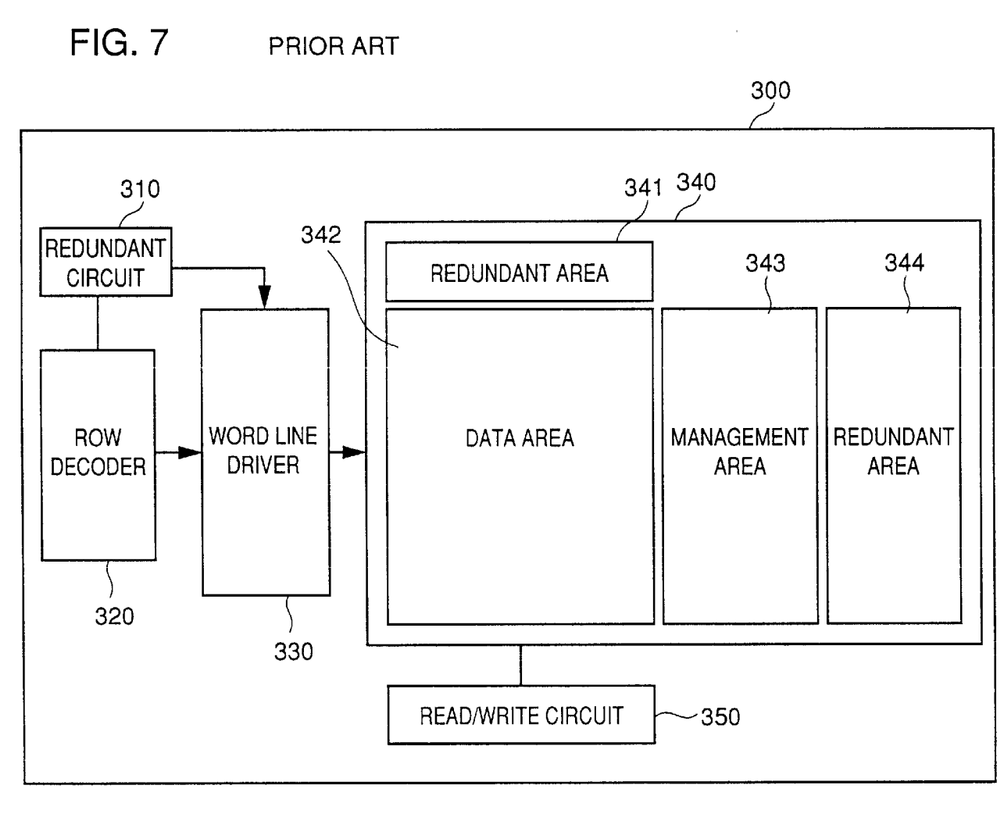
FIG. 7 is a block diagram schematically showing a configuration of a conventional non-volatile semiconductor memory device.

Referring to FIG. 7, a conventional non-volatile semiconductor memory device 300 includes a redundant circuit 310, a row decoder 320, a word line driver 330, a memory cell array 340, and a read/write circuit 350.

The memory cell array 340 is composed of a redundant area 341, a data area 342, a management (domain) area 343, and a redundant area 344. The redundant area 341 includes a non-defective sector as an alternative to a defective sector of a plurality of row sectors arranged in a row direction of the data area 342. The row sector means a "block" comprising a plurality of memory cells connected to one word line among a plurality of word lines arranged in a row direction of the data area 342. The data area 342 includes a plurality of memory cell which are arranged like an array in a row direction and a column direction.

The management area 343 holds information as to which of the plurality of sectors of the data area 342 is a defective sector. The redundant area 344 includes a non-defective sector as an alternative to a defective sector of a plurality of column sectors arrayed in a column direction of the data area 342. The column sector means a "block" comprising a plurality of memory cells connected to one bit line of a plurality of bit lines arranged in a column direction of the data area 342.

When a row sector of the data area 342 designated by a row address decoding a row address signal is a defective sector, the redundant circuit 310 selects a non-defective sector from the redundant area 341 as an alternative to the defective sector.

The row decoder 320 decodes a row address signal inputted from an external element, and then, outputs the decoded row address to the redundant circuit 310 and the word line driver 330.

The word line driver 330 activates a row sector designated by the row address from the row decoder 320. Further, the word line driver 330 selects a non-defective sector from the redundant area 341 as an alternative to the defective sector of the data area 342 on the basis of a selecting signal from the redundant circuit 310.

The read/write circuit 350 reads and writes a data to a memory cell designated by a word line and a bit line.

Figure 8:
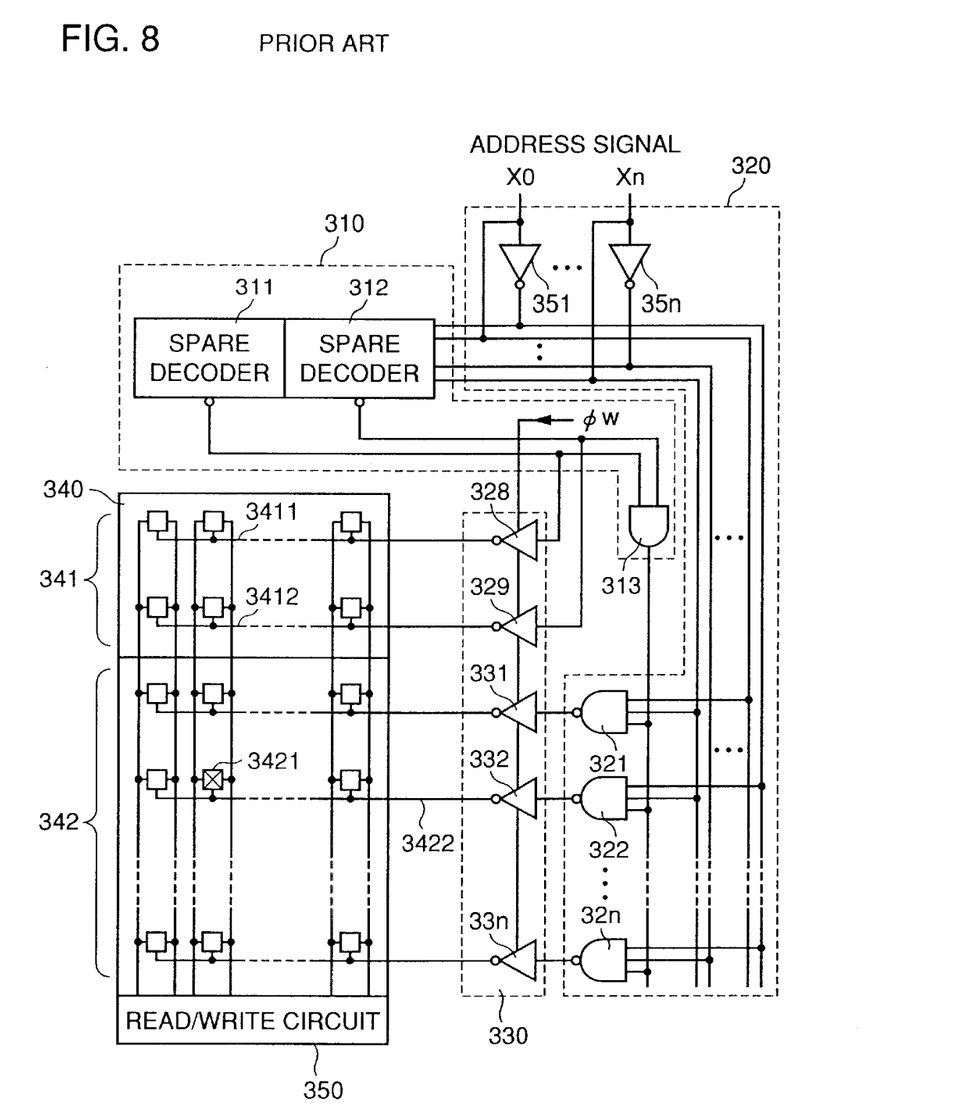
FIG. 8 is a circuit diagram showing a redundant circuit, a row decoder and a word line driver of the conventional non-volatile semiconductor memory device shown in FIG. 7.

Referring now to FIG. 8, the redundant circuit 310 is composed of spare decoders 311 and 312, and an AND gate 313. FIG. 8 shows the case where two non-defective sectors 3411 and 3412 is included in the redundant area 341. The spare decoders 311 and 312 decode address signals X0 to Xn, and then, when the decoded row address is a defective sector, inactivates all of a plurality of the sectors included in the data area 342 while outputting an L (logical low) level or H (logical high) level signal in order to activate a non-defective sector of the redundant area 341 as an alternative to the defective sector. For example, when selecting the non-defective sector 3411, the spare decoder 311 outputs an L level signal; on the other hand, the spare decoder 312 outputs an H level signal. In this case, these spare decoders 311 and 312 output an H level signal when a sector designated by the address signals X0 to Xn is a non-defective sector.

The AND gate 313 operates a logical product of the L level signal or H level signal outputted from the spare decoders 311 and 312.

The row decoder 320 includes NAND gates 321 to 32n and inverters 351 to 35n. These inverters 351 to 35n invert the address signals X0 to Xn, respectively. Each of the NAND gates 321 to 32n operates a logical product of an output signal of the AND gate 313 and a logical product of two signals selected from the address signals X0 to Xn and /X0 to /Xn, and then, outputs an inverted signal of the operation result.

The word line driver 330 includes inverters 328, 329 and 331 to 33n. The inverters 328 and 329 receive output signals from the spare decoders 311 and 312, and then, selectively activate two non-defective sectors 3411 and 3412 included in the redundant circuit 341. Moreover, Each of inverters 331 to 33n receives each output signal from the NAND gates 321 to 32n, and then, selectively activates a sector of the corresponding data area 342.

The memory cell 340 includes a plurality of memory cells which are arranged like an array of m row x n column.

When the memory cell 3421 of the data area 342 is defective, a sector 3422 becomes a defective sector. Therefore, when address signals X0 to Xn and /X0 to /Xn designating the defective sector 3422 are inputted, the spare decoders 311 and 312 output a signal for selecting the sector 3411 of the redundant area 341 as an alternative to the defective sector 3422. More specifically, the spare decoder 311 outputs an L level signal; on the other hand, the spared decoder 312 outputs an H level signal.

Whereupon the AND gate 313 outputs an L level signal to the NAND gates 321 to 32n of the row decoder 320. Each of the NAND gates 321 to 32n necessarily outputs an H level signal because an L level signal is inputted from the AND gate 313 although two H level signals are inputted for designating a sector from the address signals X0 to Xn and /X0 to /Xn. Each of inverters 331 to 33n of the word line driver 330 receives an H level signal from the NAND gates 321 to 32n, and then, outputs an L level signal so as to activate the corresponding sector. Namely, when the address signals X0 to Xn and /X0 to /Xn designating the defective sector 3422 are inputted, all sectors of the data area 342 are inactivated.

On the other hand, the inverter 328 of the word line driver 330 receives an L level signal from the spare decoder 311, and then, outputs an H level signal so as to activate the non-defective sector 3411. Moreover, the inverter 329 receives an H level signal from the spare decoder 312, and then, outputs an L level signal so as to inactivate the non-defective sector 3412. By doing so, a non-defective sector 3412 of the redundant area 341 is selected as an alternative to the defective sector 3422 of the data area 342. Then, a bit line corresponding to a column address decoded by a column decoder (not shown) is activated, and then, the read/write circuit 50 writes, reads and erases a data to each of n memory cells connected to the non-defective sector 3411.

Figure 9:
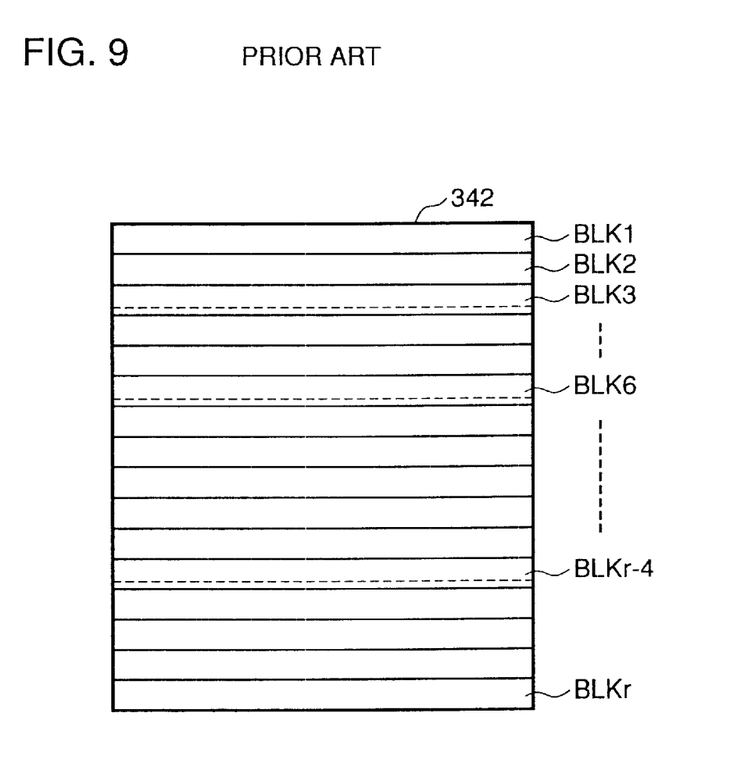
FIG. 9 is a view showing a physical arrangement of defective sectors included in a data area of the conventional non-volatile semiconductor memory device shown in FIG. 7.

In the non-volatile semiconductor memory device 300, as shown in FIG. 9, the data area 342 is divided into blocks BLK1 to BLKr including a predetermined number of row sectors, and then, write, read and erase of data are carried out using blocks BLK1 to BLKr as a management unit. Each of blocks BLK1 to BLKr includes 8 sectors, for example.

The above method of using the blocks BLK1 to BLKr as a management unit is called as an MGM (Mostly Good Memory) method. This MGM method is a method of making usable non-volatile semiconductor memory device even if all of blocks BLK1 to BLKr are not composed of a non-defective sector. More specifically, according to the MGM method, the non-volatile semiconductor memory device is usable in a manner that even if a defective sector is included in one block, an access is made to a non-defective sector as an alternative to the defective sector. Namely, as described above, the non-volatile semiconductor memory device is usable in a manner that an access is made to the non-defective sector 3411 of the redundant area 341 as an alternative to the defective sector 3422 of the data area 342.

Figure 10:
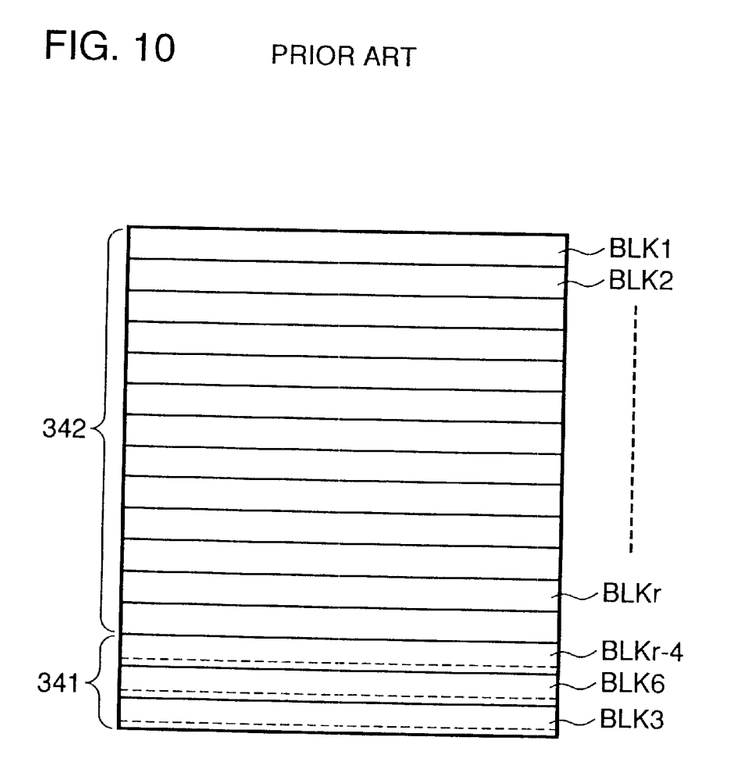
FIG. 10 is a view showing a logical arrangement of defective sectors included in a data area of the conventional non-volatile semiconductor memory device shown in FIG. 7.

However, as shown in FIG. 9, in the case where blocks BLK3, BLK6 and BLKr-4 of the data area 342 include a defective sector, according to the aforesaid MGM method, these blocks make a logical arrangement as shown in FIG. 10 in the case of providing a non-defective sector as an alternative to the defective sector. More specifically, this is the same arrangement such that the blocks BLK3, BLK6 and BLKr-4 are provided in the redundant area 341. Because, according to the method of using each of the blocks BLK1 to BLKr as a management unit, no access is made with respect to the blocks BLK3, BLK6 and BLKr-4 including a defective sector; therefore, these blocks BLK3, BLK6 and BLKr-4 are treated as a defective block.

Accordingly, in the case where each of blocks BLK1 to BLKn includes 8 sectors, 24 sectors (=3×8) become a defective sector; for this reason, there is a problem of reducing an MGM rate.

SUMMARY OF THE INVENTION

The present invention has been made taking the aforesaid problem in the prior art into consideration. It is, therefore, an object of the present invention to provide a non-volatile semiconductor memory device having a low defective rate.

In order to achieve the above object, the present invention provides a non-volatile semiconductor memory device which executes data write, read and erase using a block including a plurality of sectors having a plurality of memory cells and arranged in a row direction, comprising: a memory cell array having a data area including a plurality of the blocks; a sector selecting circuit inputting a row address signal for designating each of the plurality of sectors included in the data area, selecting an alternate non-defective sector as an alternative to a defective sector when the address signal designates the defective sector, and making no selection of the alternate non-defective sector when the address signal designates the alternate non-defective sector; and a sector activation circuit for activating a sector selected by the sector selecting circuit, and for inactivating a sector which is not selected by the sector selecting circuit, the alternate non-defective sector being provided in at least one block in response to the number of the defective sectors.

In the non-volatile semiconductor memory device of the present invention, data write, read and erase are executed using a block including a plurality of sectors as a unit. In the case of making an access to each of the plurality of sectors included in the data area, when a sector designated by a row address signal is a defective sector, an access is made to an alternate non-defective sector as an alternative to the defective sector, and then, data write, read and erase are executed.

Moreover, when the sector designated by the row address signal is an alternate non-defective sector, no selection of the alternate non-defective sector is made. The alternate non-defective sector is provided in response to the number of the defective sectors. In the case where there exist a plurality of the defective sectors, a plurality of alternate non-defective sectors corresponding to the defective sectors are collected to one block. When the number of the alternate non-defective sectors exceeds the number of sectors included in one block, the alternate non-defective sectors are provided in a plurality of blocks.

Therefore, according to the present invention, the defective sectors included in the data area is collected to one place. As a result, it is possible to make high a rate of making an access to a non-defective sector when accessing a sector of the data area.

Preferably, the sector selecting circuit makes no selection with respect to all of a plurality of the sectors when the row address signal designates the alternate non-defective sector.

When the sector designated by the row address signal is an alternate non-defective sector, no selection is made with respect to all of a plurality of sectors included in the data area, and thereby, an access is made to the defective sector as an alternative to the alternate non-defective sector. Namely, no selection is made with respect to all of a plurality of sectors, and thereby, a data "0" is outputted; therefore, this means that the defective sector is selected as an alternative to the alternate non-defective sector.

Therefore, according to the present invention, only when the defective sector is designated, the alternate non-defective sector is merely selected as an alternative to the defective sector, and thereby, it is possible to replace the defective sector with the alternate non-defective sector.

Preferably, the data area includes a redundant area comprising at least one block provided with the alternate non-defective sector.

The redundant area provided with the alternate non-defective sector is included in the data area.

Therefore, according to the present invention, an occupied area is made small, and it is possible to make high a probability of making an access to a non-defective sector.

Preferably, the sector selecting circuit includes: a row decoder for decoding the row address signal, and for outputting a decoded row address to the sector activation circuit; and a redundant circuit for outputting a relief signal for making no selection of the defective sector when the row address signal designates the defective sector to the row decoder, for outputting an activation signal for activating the alternate non-defective sector to the sector activation circuit, and for outputting a no selection signal for making no selection of the plurality of sectors when the row address signal designates the alternate non-defective sector.

The row decoder decodes a row address signal, and then, outputs the decoded row address signal to the activation circuit. When a sector designated by the row address signal is a defective sector, the redundant circuit outputs a relief signal to the row decoder so as to make no selection of the defective sector, and outputs an activation signal to the activation circuit so as to activate an alternate non-defective sector as an alternative to the defective sector of no selection. Moreover, when the sector designated by the row address signal is an alternate non-defective sector, the redundant circuit outputs a no-selection signal to the row decoder so as to make no selection with respect to all of a plurality of sectors.

Therefore, according to the present invention, it is possible to make an access to the alternate non-defective sector as an alternative to the defective sector by the redundant circuit.

Preferably, the row decoder includes a plurality of first logic elements which is provided so as to correspond to the plurality of sectors included in the data area, and operates a logical product of the row address signal and the relief signal, and the sector activation circuit includes: at least one second logic element which is provided so as to correspond to the alternate non-defective sector included in the redundant area, and operates a logical product of an output signal from the first logic element and the activation signal; and a plurality of third logic elements which are provided so as to correspond to the plurality of sectors included in the data area with the exception of the redundant area, and inverts the output signal from the first logic element.

The first logic element of the row decoder operates a logical product of the row address signal and the relief signal from the redundant circuit, and then, outputs the operation result to the activation circuit. The second logic element of the activation circuit operates a logical product of an output signal of the row decoder and an activation signal from the redundant circuit, and then, activates the corresponding alternate non-defective sector on the basis of the operation result. Moreover, the third logic element of the activation circuit inverts the output signal of the row decoder so as to activate the corresponding sector.

Therefore, according to the present invention, when the row address signal designates the defective sector of the data area and when the row address signal designates the alternate non-defective sector of the redundant area, the logic of the relief signal and the activation signal is changed, and thereby, it is possible to replace the defective sector with the alternate non-defective sector.

Preferably, the redundant circuit includes a programmable ROM which stores a redundant information indicative that an alternate non-defective sector as an alternative to a defective sector in areas except the redundant area is held in the redundant area.

The redundant circuit includes the programmable ROM which stores and holds a redundant information indicative that which of the plurality of sectors of the data area is a defective sector. When the row address signal is inputted to the sector selecting circuit from the external element, an access is made to the programmable ROM, and then, a decision is made whether or not a sector designated by the row address signal is a defective sector. In the case where the defective sector is designated, an alternate non-defective sector is selected as an alternative to the defective sector; on the other hand, in the case where the alternate non-defective sector is designated, no selection is made with respect to all of the plurality of sectors.

Therefore, according to the present invention, it is possible to accurately make an access to the alternate non-defective sector as an alternative to the defective sector.

Preferably, the programmable ROM of the redundant circuit stores the redundant information by a fuse system.

The redundant circuit determines whether or not the sector designated by the row address signal is a defective sector by making a decision whether or not the fuse is blown.

Therefore, according to the present invention, it is possible to accurately make an access to the alternate non-defective sector as an alternative to the defective sector with a simple configuration.

The foregoing and other objects, features, aspects and advantages of the present invention will become more apparent from the following detailed description of the present invention when taken in conjunction with the accompanying drawing.

DETAILED DESCRIPTION OF THE PREFERRED EMBODIMENTS

One embodiment of the present invention will be described below with reference to the accompanying drawings. In this case, like reference numerals are used to designate the same or corresponding part in figures, and the details are not repeated.

Figure 1:
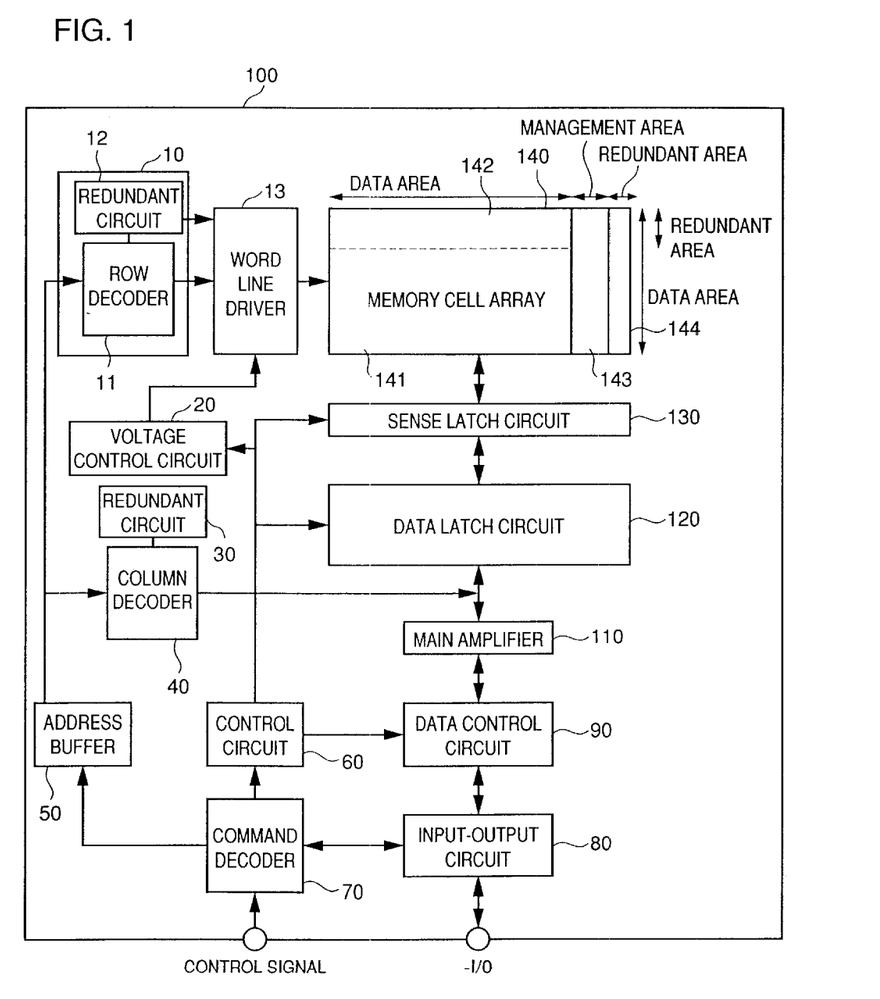
FIG. 1 is a block diagram schematically showing a configuration of a non-volatile semiconductor memory device according to one embodiment of the present invention.

As shown in FIG. 1, according to one embodiment of the present invention, a non-volatile semiconductor memory device 100 includes a sector selecting circuit 10, a word line driver 13, a voltage control circuit 20, a redundant circuit 30, a column decoder 40, an address buffer 50, a control circuit 60, a command decoder 70, an input-output circuit 80, a data control circuit 90, a main amplifier 110, a data latch circuit 120, a sense latch circuit 130 and a memory cell array 140.

The sector selecting circuit 10 includes a row decoder 11 and a redundant circuit 12. The memory cell array 140 includes a data area 141, a management area 143 and a redundant area 144. The data area 141 includes a redundant area 142.

The data area 141 includes a plurality of memory cells which are arranged like an array in a row direction and a column direction. The redundant area 142 includes an alternate non-defective sector as an alternative to a defective sector of a plurality of row sectors arranged in a row direction of areas except the redundant area 142 of the data area 141. The row sector means a "block" which includes a plurality of memory cells connected to one word line of a plurality of word lines arranged in a row direction of the data area 141.

The management area 143 stores information relative to a defective sector. The redundant area 144 includes a non-defective sector as an alternative to a defective sector of a plurality of column sectors arranged in a column direction of the data area 141. The column sector means a "block" which includes a plurality of memory cells connected to one bit line of a plurality of bit lines arranged in a column direction of the data area 141.

As described later, when a row sector designated by a row address signal is a non-defective sector, the sector selecting circuit 10 selects the non-defective sector, and then, when the row sector designated by a row address signal is a defective sector, selects an alternate non-defective sector of the redundant area 142 as an alternative to the defective sector. Further, when the row sector designated by a row address signal is an alternate non-defective sector of the redundant area 142, the sector selecting circuit 10 makes no selection with respect to all sectors of the data area 141.

The row decoder 11 is activated on the basis of a word enable signal /WE from the address buffer 50, and then, outputs a row address signal to the redundant circuit 12, and further, decodes the row address signal so as to output a row address to the word line driver 13.

The redundant circuit 12 decodes a row address signal according to a method described later, and then, when a row sector designated by the decoded row address is a defective sector, outputs a relief signal for making no selection of the defective sector and an activation signal for activating an alternate non-defective sector of the redundant area 142 as an alternative to the defective sector. Further, when the decoded row address designates the alternate non-defective sector of the redundant area 142, the redundant circuit 12 outputs a non-selection signal for making no selection of all row sectors of the data area 141. Furthermore, when a row sector designated by the decoded row address is a non-defective sector, the redundant circuit 12 outputs a signal for selecting any of a plurality of sectors existing in the data area 141 except the redundant area 142.

The word line driver 13 activates a word line corresponding to a row address from the row decoder 11. Further, the word line driver 13 activates an alternate non-defective sector as an alternative to the defective sector according to the relief signal and the activation signal, and then, inactivates all row sectors of the data area 141 according to the non-selection signal.

The voltage control circuit 20 outputs a high voltage to the word line driver 13 on the basis of the control by the control circuit 60 in writing and erasing a data to a memory cell, and then, outputs a voltage lower than that in write and erase to the word line driver 13 in reading the data from the memory cell.

The redundant circuit 30 decodes a column address signal inputted via the column decoder 40 from the address buffer 50, and then, when a column sector of the data area 141 designated by the decoded column address is a defective sector, selects a non-defective sector of the redundant area 144 as an alternative to the defective sector.

The column decoder 40 is activated on the basis of a bit enable signal /BE from the address buffer 50, and then, decodes the column address signal so as to output the decoded column address to the data latch circuit 120.

The address buffer 50 activates the row decoder 11 on the basis of a word enable signal /WE from the command decoder 70, and activates the column decoder 40 on the basis of a bit enable signal /BE. Further, the address buffer 50 outputs a row address signal to the row decoder 11, and outputs a column address signal to the column decoder 40.

The control circuit 60 controls the voltage control circuit 20, the data control circuit 90, the main amplifier 110, the data latch circuit 120 and the sense latch circuit 130. The command decoder 70 decodes various control signals such as a chip enable signal /CE inputted via an input-output terminal, a word enable signal /WE, a bit enable signal /BE and the like, and then, outputs the decoded control signal to the address buffer 50, the control circuit 60 and the input-output circuit 80.

The input-output circuit 80 outputs a data from the input-output terminal to the data control circuit 90 according to a control signal from the command decoder 70 in data write while outputting a data from the data control circuit 90 to the input-output terminal in data read.

The data control circuit 90 is controlled by the control circuit 60, and outputs a data from the input-output circuit 80 to the data latch circuit 120 via the main amplifier 110 in data write while outputting a data amplified by the main amplifier 110 to the input-output circuit 80 in data read.

The main amplifier 110 amplifies a data read from a memory cell, and then, outputs the read data to the data control circuit 90. The data latch circuit 120 is controlled by the control circuit 60, and then, activates a bit line designated by a column address from the column decoder 40. Further, the data latch circuit 120 writes a data to the activated bit line in data write while outputting a data amplified by the sense latch 130 to the main amplifier 110 in data read.

The sense latch circuit 130 is a latch type sense amplifier, and is controlled by the control circuit 60. Further, the sense latch circuit 130 amplifies a data on the activated bit line, and then, outputs the data to the data latch circuit 120.

Figure 2:
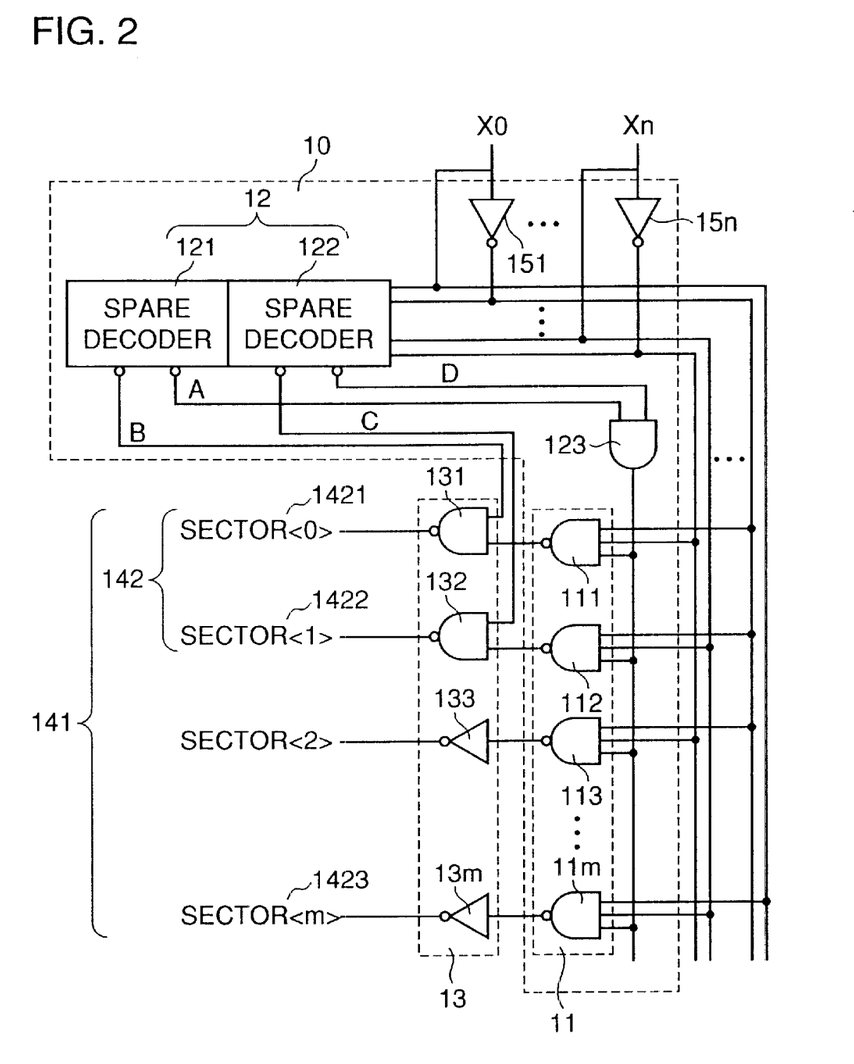
FIG. 2 is a circuit diagram showing a sector selecting circuit of the non-volatile semiconductor memory device shown in FIG. 1.

As shown in FIG. 2, the sector selecting circuit 10 includes a redundant circuit 12, a row decoder 11, an AND gate 123, and inverters 151 to 15n. The redundant circuit 12 includes spare decoders 121 and 122. The row decoder 11 includes NAND gates 111 to 11m. The word line driver 13 includes NAND gates 131 and 132 and inverters 133-13m. In FIG. 2, an alternate non-defective sector provided in the redundant area 142 is two, that is, a sector <0> 1421 and a sector <1> 1422. Therefore, sectors <2> to <m> are sectors existing in the data area 141 except the redundant area 142.

The spare decoders 121 and 122 decode address signals X0 to Xn, and then, when a row sector designated by the decoded row address is a defective sector, inactivate all row addresses selecting a plurality of sectors <0> to <m> of the data area 141 while outputting an L (logical low) level or H (logical high) level signals A to D for activating an alternate non-defective sector of the redundant area 142 as an alternative to the defective sector. Further, when a row sector designated by the decoded row address is alternate non-defective sectors 1421 and 1422 of the redundant area 142, the spare decoders 121 and 122 output an L level or H level signals A to D for inactivating all row sectors of the data area 141. Furthermore, when a row sector designated by the decoded row address is a non-defective sector, the spare decoders 121 and 122 output H level or L level signals A to D for selecting the designated row sector.

The AND gate 123 operates a logical product of H level or L level signals A and D from the spare decoders 121 and 122, and then, outputs it.

Each of the NAND gates 111 to 11m of the row decoder 11 operates a logical product of an output signal of the AND gate 123 and a logical product of two signals selected from the address signals X0 to Xn and /X0 to /Xn, and then, outputs an inverted signal of the operation result. Each of the inverters 151 to 15n inverts each of the address signals X0 to Xn.

The word line driver 13 includes NAND gates 131 and 132, and inverters 133 to 13m. The NAND gate 131 receives a signal B from the spare decoder 121 and an output signal from the NAND gate 111, and then, operates a logical product of two signals, and further, selectively activates the alternate non-defective sector 1421. Moreover, the NAND gate 132 receives a signal C from the spare decoder 122 and an output signal from the NAND gate 112, and then, operates a logical product of two signals, and further, selectively activates the alternate non-defective sector 1422. Each of the inverters 133 to 13m individually receives each output signal from the NAND gates 113 to 13m, and then, selectively activates the corresponding sector of the data area 141.

Figure 3:
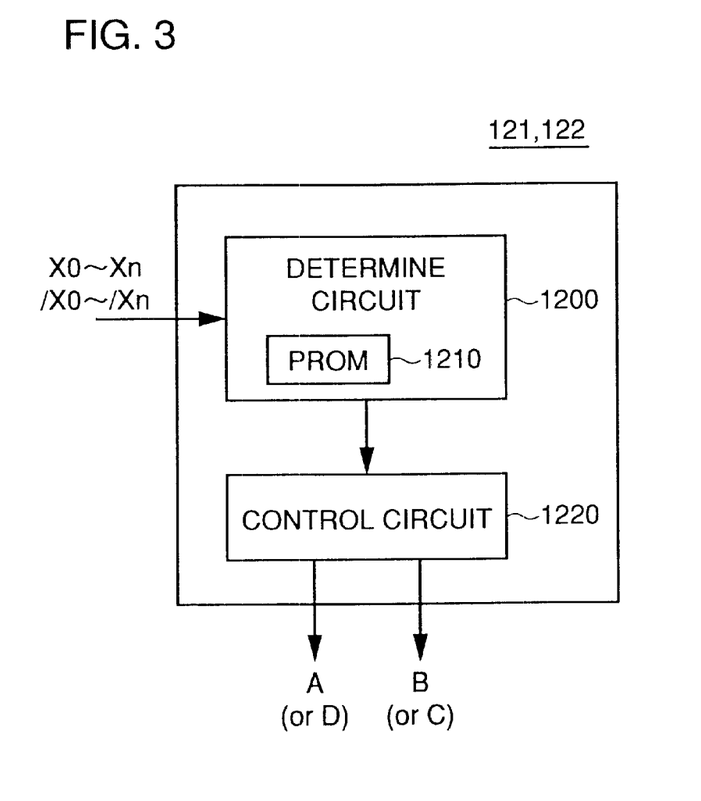
FIG. 3 is a circuit diagram showing a spare decoder of the sector selecting circuit shown in FIG. 2.

As shown in FIG. 3, each of the spare decoders 121 and 122 includes a determiner circuit 1200 and a control circuit 1220. The determiner circuit 1200 includes a PROM (Programmable Read Only Memory) 1210. The PROM 1210 stores a redundant information. The redundant information is composed of information as to which each of a plurality of row sectors included in the data area 141 except the redundant area 142 is a defective or non-defective sector, and information indicative of holding an alternate non-defective sector as an alternative to the defective sector in the redundant area 142 in the case where the row sector is a defective sector.

The determiner circuit 1200 receives the address signals X0 to Xn and /X0 to /Xn, and then, decodes these address signals X0 to Xn and /X0 to /Xn, and thus, makes a decision as to which a row sector designated by the decoded row address is a defective or non-defective sector, on the basis of the redundant information stored in the PROM 1210. When the row sector designated by the row address is a defective sector, the determiner circuit 1200 outputs a signal indicative that the row sector is a defective sector, and a signal indicative of a sector number of the alternate non-defective sectors of the redundant area 142 as an alternative to the defective sector, to the control circuit 1220. Further, when the row sector designated by the row address is an alternate non-defective sector of the redundant area 142, the determiner circuit 1200 outputs a signal indicative that the row sector is an alternate non-defective sector, to the control circuit 1220. Furthermore, when the row sector designated by the row address is a non-defective sector, the determiner circuit 1200 outputs a signal indicative that the row sector is a non-defective sector, to the control circuit 1220.

Whereupon, when the defective sector is designated, the control circuit 1220 outputs a signal A (or signal D) for inactivating each row address selecting each of a plurality of row sectors included in the data area 141, and a signal B (or signal C) for activating an alternate non-defective sector of the redundant area 142. Further, when an alternate non-defective sector of the redundant area 142 is designated, the control circuit 1220 outputs signals A to D for inactivating all row sectors of the data area 141. Furthermore, when a non-defective sector is designated, the control circuit 1220 outputs signals A to D for enabling a selection of each of a plurality of row sectors included in the data area 141 according to the address signals X0 to Xn and /X0 to /Xn.

Figure 4A:
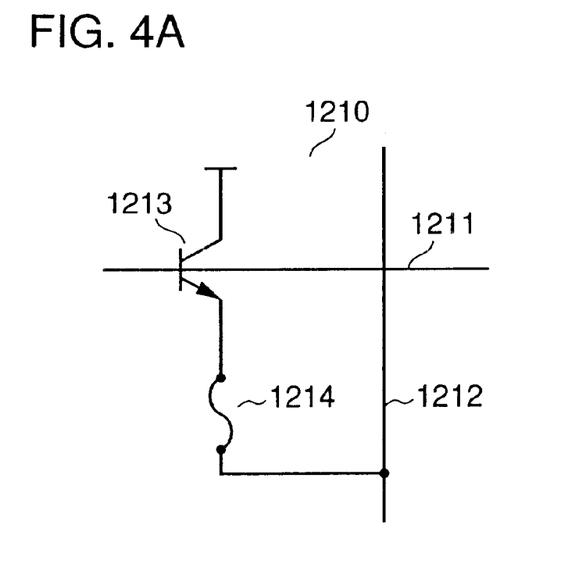
FIG. 4A is a circuit diagram showing a state that no information is written in a fuse memory cell.
Figure 4B:
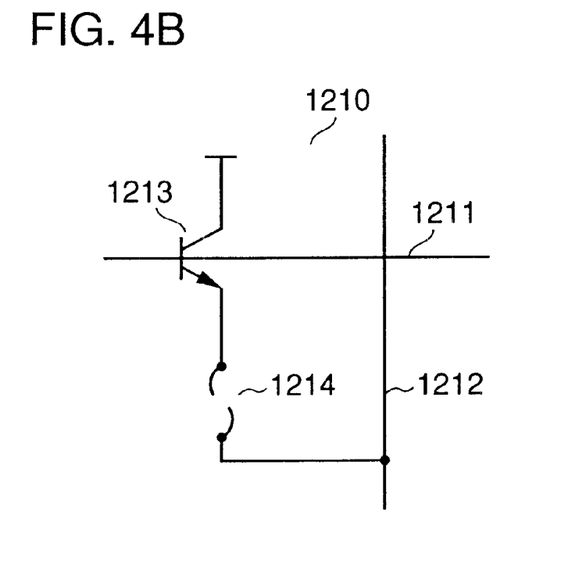
FIG. 4B is a circuit diagram showing a state that information is written in a memory cell by a fuse system.

As shown in FIG. 4A and FIG. 4B, the PROM 1210 is a fuse type PROM, and comprises an npn transistor 1213 and a fuse 1214. The fuse 1214 is manufactured of using a material such as nickel chromium (NiCr), tungsten titanium (TiW), polysilicon (poly-Si) and the like. A data write is carried out by applying a current pulse to a fuse so that the fuse is fused. A data read is carried out on the basis of the result as to whether or not a current flows through a bit line 1211 in a state that a read voltage is applied to the word line 1211 so as to turn on the npn transistor. FIG. 4A shows a state before a data is written, and FIG. 4B shows a state that a data has been written.

In the case where each of a plurality of row sectors included in the data area 141 is a defective sector, the fuse 1241 is fused, and thereby, information indicative that the row sector is a defective sector is written, while the fuse 1241 is fused, and thereby, information designating a sector number of a non-defective sector as an alternative to the defective sector is written. Therefore, in the case where each of a plurality of row sectors is a non-defective sector, the fuse 1241 is not fused, and also, no sector number of an alternate non-defective sector as an alternative to the non-defective sector is written.

Whereupon, the determiner circuit 1200 makes a decision as to whether or not the row sector designated by the decoded row address is a defective sector on the basis of the result whether or not a current flows through the bit line 1212 when applying a read voltage to the word line 1211. In the case where the row sector is a defective sector, the determiner circuit 1200 acquires a sector number of an alternate non-defective sector as an alternative to the defective sector from the PROM 1210 on the basis of the result whether or not a current flows through the bit line 1212.

Referring again to FIG. 2, an operation of the sector selecting circuit 10 will be described below in the case where a defective sector, an alternate non-defective sector and a non-defective sector are designated according to the address signals X0 to Xn and /X0 to /Xn. When testing the non-volatile semiconductor memory device 100, a detection is made which of the plurality of row sectors of the data area 141 is a defective sector. Then, a sector is previously determined as an alternate non-defective sector of the redundant area 142 as an alternative to the defective sector. In FIG. 2, when the sector <m> 1423 of a defective sector is designated according to the address signals X0 to Xn and /X0 to /Xn, the spare decoder 121 activates the sector <0> 1421 as an alternate non-defective sector; on the other hand, when a sector <s>($2 \leq s < m$)(not shown) is designated according to the address signals X0 to Xn and /X0 to /Xn, the spare decoder 122 activates the sector <1> 1422 as an alternate non-defective sector.

Therefore, the PROM 1210 of the spare decoder 121 stores a signal indicative that the sector <m> 1423 is a defective sector, and a sector number of the sector <0> 1421 which is an alternate non-defective sector as an alternative to the sector <m> 1423. On the other hand, the PROM 1210 of the spare decoder 122 stores a signal indicative that the sector <s> is a defective sector, and a sector number of the sector <1> 1422 which is an alternate non-defective sector as an alternative to the sector <s>.

First, the following is a description on the case where a defective sector is designated according to the address signals X0 to Xn and /X0 to /Xn. The address signals X0 to Xn and /X0 to /Xn are inputted to the spare decoders 121 and 122 of the redundant circuit 12. Each of the determiner circuit 1200 of the spare decoders 121 and 122 decodes the address signals X0 to Xn and /X0 to /Xn, and then, makes a decision whether a row sector designated by the decoded row address is a defective sector according to the aforesaid method. In this case, the determiner circuit 1200 of the spare decoder 121 receives a signal indicative that the sector <m> 1423 is a defective sector, and a sector number of the sector <0> 1421 which is an alternate non-defective sector as an alternative to the sector <m> 1423 from the PROM 1210, and then, outputs them to the control circuit 1220. On the other hand, the determiner circuit 1200 of the spare decoder 122 outputs a signal indicative that the sector <m> 1423 is a defective sector and a signal indicative that a non-defective sector is designated because no sector number of an alternate non-defective sector is stored, to the control circuit 1220.

Whereupon, the control circuit 1220 of the spare decoder 121 recognizes that the defective sector is designated, on the basis of the signal indicative that the sector <m> 1423 is a defective sector, and then, outputs an L level signal A for inactivating a row address selecting the sectors <2> to <m> of the data area 141 to the AND gate 123 while outputting an L level signal B for activating the sector <0> 1421 of the redundant area 142 to the NAND gate 131 of the word line driver 13. Moreover, the control circuit 1220 of the spare decoder 122 outputs an H level signal C to the AND gate 123 while outputting an H level signal D to the NAND gate 132 of the word line driver 13.

The AND gate 123 outputs an L level signal to each of the NAND gates 111 to 10m on the basis of the L level signal A. Therefore, each of the NAND gates 111 to 11m necessarily outputs an H level signal regardless of a logic of the inputted address signals X0 to Xn and /X0 to /Xn. Namely, the spare decoder 121 outputs a signal A for inactivating all of the address signals X0 to Xn and /X0 to /Xn inputted to the row decoder 11, to the row decoder 11. Each of the inverters 133 to 13m of the word line driver 13 outputs an L level signal on the basis of an H level input signal so as to inactivate each of the sectors <2> to <m>. Moreover, the NAND gate 132 outputs an L level signal on the basis of an H level output signal of the NAND gate 112 and the H level signal C of the spare decoder 122 so as to inactivate the alternate non-defective sector 1422. On the other hand, the NAND gate 131 outputs an H level signal on the basis of an H level output signal of the NAND gate 111 and the L level signal B of the spare decoder 121 so as to activate the alternate non-defective sector 1421.

Whereby the alternate non-defective sector 1421 of the redundant area 142 is selected as an alternative to the sector <m> 1423 which is a defective sector, and thus, write, read and erase of data are executed.

Next, the following is a description on the case where an alternate non-defective sector of the redundant area 142 is designated according to the address signals X0 to Xn and /X0 to /Xn. The determiner circuit 1200 of the spare decoders 121 and 122 searches the PROM 1210 on the basis of the decoded row address, and then, makes a detection such that an alternate non-defective sector is designated. Then, the determiner circuit 1200 of the spare decoders 121 and 122 outputs a signal indicative that an alternate non-defective sector is designated, to the control circuit 1220.

Whereupon, the control circuit 1220 of the spare decoders 121 and 122 outputs L level signals A and D and H level signals B and C. The AND gate 123 outputs an L level signal to each of the NAND gates 111 to 11m of the row decoder 11. Each of the NAND gates 111 to 11m of the row decoder 11 necessarily outputs an H level signal regardless of a logic of the inputted address signals X0 to Xn and /X0 to /Xn. Each of the inverters 133 to 13m of the word line driver 13 outputs an L level signal on the basis of an H level input signal so as to inactivate each of the sectors <2> to <m>. Moreover, the NAND gate 132 outputs an L level signal on the basis of an H level output signal of the NAND gate 112 and the H level signal C of the spare decoder 122 so as to inactivate the alternate non-defective sector 1422. Furthermore, the NAND gate 131 outputs an L level signal on the basis of an H level output signal of the NAND gate 111 and the H level signal B of the spare decoder 121 so as to inactivate the alternate non-defective sector 1421.

Namely, when the alternate non-defective sector of the redundant area 142 is designated by the row address, all sectors of the data area 141 are inactivated (also, called as "non-selection"). In this case, a bit line is activated, and thereby, a data is read out; however, only data "0" is read from any memory cells. Usually, there is no case where the data is "0" in any memory cells; therefore, all sectors of the data area 141 are inactivated, and thereby, it is possible to select a defective sector. Moreover, a data "1" may be read from all memory cells, and not data "0".

Finally, the following is a description on the case where a non-defective sector is designated according to the address signals X0 to Xn and /X0 to /Xn. In this case, the determiner circuit 1200 of the spare decoders 121 and 122 searches the PROM 1210 on the basis of the row address decoding the address signals X0 to Xn and /X0 to /Xn, and then, makes a detection such that the row sector designated by the row address is a non-defective sector. Then, the determiner circuit 1200 of the spare decoders 121 and 122 outputs a signal indicative that a non-defective sector is designated, to the control circuit 1220.

Whereupon, the control circuit 1220 of the spare decoders 121 and 122 outputs H level signals A and D indicative that the row decoder 11 enables a selection of any of the sectors <2> to <m> according to the address signals X0 to Xn and /X0 to /Xn, to the AND gate 123. Further, the control circuit 1220 outputs H level signals B and C for inactivating the alternate non-defective sectors 1421 and 1422 of the redundant area 142 to the NAND gates 131 and 132 of the word line driver 13.

The AND gate 123 outputs an H level signal to each of the NAND gates 111 to 11m of the row decoder 11. In addition to an output signal from the AND gate 123, two address signals selected from the address signals X0 to Xn and /X0 to /Xn are inputted to each of the NAND gates 111 to 11m; therefore, each of the NAND gates 111 to 11m outputs a signal according to a logic of the two address signals. For example, when the sector <2> is designated by a row address, two address signals with H level are inputted to the NAND gate 113. Therefore, the NAND gate 113 outputs an L level signal, and the inverter 133 of the word line driver 13 outputs an H level signal on the basis of the L level signal so as to activate the sector <2>.

Two address signals, one of which is an L level, are inputted to each of the NAND gates 111, 112 . . . 11m except the NAND gate 113 of the row decoder 11; therefore, each of the NAND gates 111, 112 . . . 11m except the NAND gate 113 outputs an H level signal. Whereupon, each of the inverters 134 to 13m of the word line driver 13 outputs an L level signal on the basis of the H level signal so as to inactivate the sectors <3> to <m>. Moreover, the NAND gate 131 outputs an L level signal on the basis of an H level output signal of the NAND gate 111 and the H level signal B so as to inactivate the alternate non-defective sector 1421. On the other hand, the NAND gate 132 outputs an L level signal on the basis of an H level output signal of the NAND gate 112 and the H level signal C so as to inactivate the alternate non-defective sector 1422.

Whereby the non-defective sector designated by the row address is selected, and thus, write, read and erase of data are executed.

In the above case, when the alternate non-defective sector is designated by the address signals X0 to Xn and /X0 to /Xn, all row sectors of the data area 141 are inactivated, and thereby, the defective sector is selected. In the present invention, in general, the defective sector may be replaced with an alternate non-defective sector in one to one correspondence. Namely, when a non-defective sector is designated by the address signals X0 to Xn and /X0 to /Xn, an alternate non-defective sector is selected as an alternative to the defective sector, and when the alternate non-defective sector is designated by the address signals X0 to Xn and /X0 to /Xn, the defective sector corresponding to the alternate non-defective sector may be selected.

Figure 5:
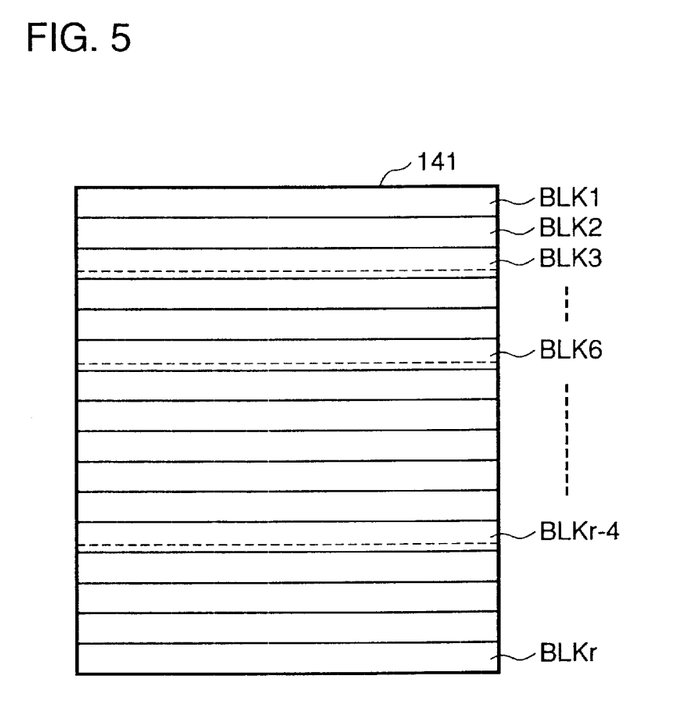
FIG. 5 is a view showing a physical arrangement of defective sectors included in a data area of the non-volatile semiconductor memory device shown in FIG. 1.

As shown in FIG. 5, the data area 141 of the non-volatile semiconductor memory device 100 is divided into blocks BLK1 to BLKr each comprising a predetermined number of row sectors, and write, read and erase of data are executed using each of these blocks BLK1 to BLKr as a management unit. For example, the number of sectors constituting each of these blocks BLK1 to BLKr is 8 sectors.

Blocks BLK3, BLK6 and BLKr-4 include a defective sector, and then, in the case where three defective sectors are designated by the address signals X0 to Xn and /X0 to /Xn, as described above, an alternate non-defective sector is selected as an alternative to the defective sector, and thus, write, read and erase of data are executed. Moreover, when an alternate non-defective sector is designated by the address signals X0 to Xn and /X0 to /Xn, a defective sector corresponding to the alternate non-defective sector, that is, each defective sector included in the blocks BLK3, BLK6 and BLKr-4 is selected.

Figure 6:
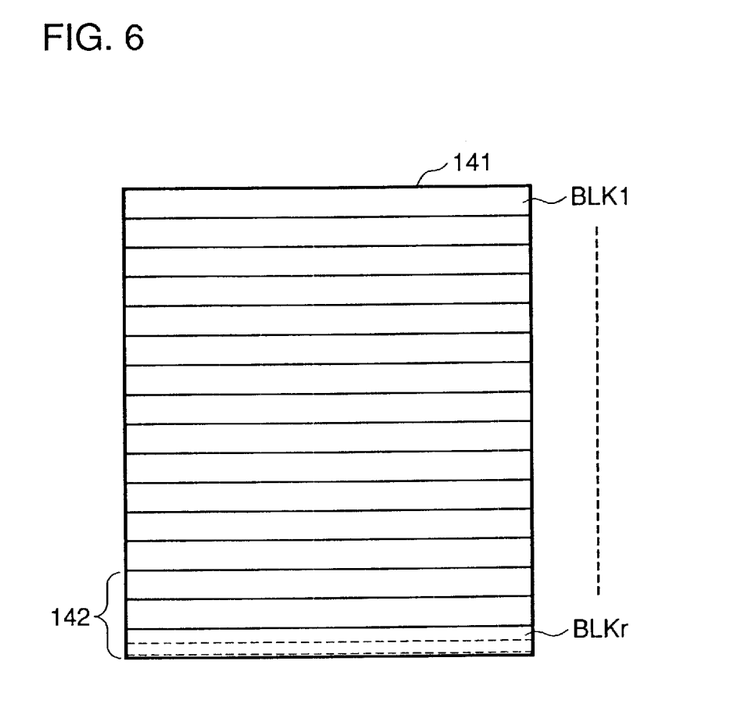
FIG. 6 is a view showing a logical arrangement of defective sectors included in a data area of the non-volatile semiconductor memory device shown in FIG. 1.

Therefore, a physical arrangement of the data area 141 is an arrangement as shown in FIG. 5 such that one defective sector exists in each of three blocks BLK3, BLK6 and BLKr-4; however, a logical arrangement of the data area 141 is an arrangement as shown in FIG. 6. As seen from FIG. 6, three defective sectors included in these blocks BLK3, BLK6 and BLKr-4 are collectively arranged in one block BLKr of the redundant area 142. This results from the following reasons; more specifically, a construction is employed such that the defective sector and the alternate non-defective sector of the redundant area 142 are arranged so as to make one-to-one correspondence, and when one row sector is designated by the address signals X0 to Xn and /X0 to /Xn, the other sector is selected; while when the other row sector is designated by the address signals X0 to Xn and /X0 to /Xn, one sector is selected. Namely, the defective sector and the alternate non-defective sector are arranged so as to make one-to-one correspondence, and thereby, it is possible to independently replace three defective sector existing three blocks BLK3, BLK6 and BLKr-4 with three alternate non-defective sectors which are collectively arranged in the block BLKr of the redundant area 142.

In the conventional non-volatile semiconductor memory device 300, as seen from the circuit diagram of the redundant circuit 310, the row decoder 320 and the word line driver 330 as shown in FIG. 8, the row sectors 3411 and 3412 arranged in the redundant area 341 are not designated by the address signals X0 to Xn and /X0 to /Xn, and the defective sector 3422 and the row sector 3411 of the redundant area 341 are not replaced with each other in one-to-one correspondence. Therefore, even if the defective sector of the data area 342 is replaced with the non-defective sector of the redundant area 341, as shown in FIG. 10, logically, three blocks BLK3, BLK6 and BLKr-4 are merely collected to the redundant area 341, and write, read and erase are executed using these three blocks BLK3, BLK6 and BLKr-4 as a defective block.

On the contrary, in the non-volatile semiconductor memory device 100 of the present invention, as shown in FIG. 5, even if one defective sector exists in each of three blocks BLK3, BLK6 and BLKr-4 (the same arrangement as the defective sector in the conventional non-volatile semiconductor memory device 300), logically, as shown in FIG. 6, three defective sectors are collectively arranged in one block BLKr of the redundant area 142; therefore, the defective block is only one, and thereby, it is possible to greatly reduce a defective rate of the non-volatile semiconductor memory device 100.

In the present invention, the alternate non-defective sector of the redundant area 142 is provided in accordance with the number of the defective sectors. The alternate non-defective sector is collected to one block of the redundant area 142 until the number of defective sectors becomes 8 sectors, and when the number of defective sectors exceeds 8 sectors, the alternate non-defective sector is arranged in two blocks of the redundant area.

The number of row sectors constituting each of blocks BLK1 to BLKr is not limited to 8 sectors, and any numbers of sectors may be used.

Moreover, in the above embodiment, the PROM 1210 is a fuse type PROM. The PROM 1210 is not limited to the fuse type PROM, and may be a PROM using a junction short-circuit type memory cell or dielectric breakdown type memory cell.

Referring again to FIG. 1, an operation of write, read and erase of data to the non-volatile semiconductor memory device 100 will be described below. First, the following is a description on a write operation. When a chip enable signal /CE is inputted via an input-output terminal, the command decoder 70 generates an internal control signal on the basis of the chip enable signal /CE, and then, outputs the internal control signal to the address buffer 50, the control circuit 60 and the input-output circuit 80. The control circuit 60 controls the voltage control circuit 20 so that the voltage control circuit 20 outputs a write voltage to the word line driver 13 and shifts the data control circuit 90 and the data latch circuit 120 to a write mode.

On the other hand, the address buffer 50 activates the row decoder 11 of the sector selecting circuit 10 on the basis of the word enable signal /WE inputted via input-output terminal, and outputs address signals X0 to Xn and /X0 to /Xn to the row decoder 11. Whereupon, as described above, the sector selecting circuit 10 selects an alternate non-defective sector when a defective sector is designated by the address signals X0 to Xn and /X0 to /Xn, selects a defective sector when an alternate non-defective sector is designated, and selects a non-defective sector when a non-defective sector is designated. Further, the sector selecting circuit 10 activates the selected row sector using a voltage from the voltage control circuit 20. Moreover, the address buffer 50 activates the column decoder 40 on the basis of the bit enable signal /BE inputted via the input-output terminal, and outputs address signals X0 to Xn and /X0 to /Xn to the column decoder 40. The column decoder 40 decodes the address signals X0 to Xn and /X0 to /Xn, and then, outputs the decoded column address to the data latch circuit 120.

The input-output circuit 80 outputs a write data inputted from the input-output terminal to the data control circuit 90, and then, the data control circuit 90 outputs the write data to the data latch circuit 120 via the main amplifier 110. The data latch circuit 120 activates a bit line designated by the column address from the column decoder 40, and then, writes the write data to the activated bit line via the sense latch circuit 130. Whereby data is written to a plurality of memory cells of the memory cell array 140.

Next, the following is a description on a data read operation. The operation until the sector selecting circuit 10 selects a row sector designated by the address signals X0 to Xn and /X0 to /Xn is the same as the above data write operation. In data read, the control circuit 60 controls the voltage control circuit 20 so that the voltage control circuit 20 outputs a voltage lower than the data write to the word line driver 13. The voltage control circuit 20 outputs the voltage lower than the data write to the word line driver 13, and then, the word line driver 13 activates the selected row sector by the voltage lower than the data write.

The data latch circuit 120 activates a bit line designated by the column address from the column decoder 40, and the sense latch circuit 130 amplifies a data on the activated bit line, and then, outputs it to the data latch circuit 120.

The data latch circuit 120 outputs a read data to the main amplifier 110, and the main amplifier 110 further amplifies the read data, and then, outputs it to the data control circuit 90. The data control circuit 90 outputs the read data to the input-output circuit 80, and then, the input-output circuit 80 outputs the read data to the external elements via the input-output terminal.

Finally, the following is a description on an erase operation. When a data erase is executed, the control circuit 60 controls the voltage control circuit 20 so that the voltage control circuit 20 outputs the same voltage as write the data to the word line driver 13. The voltage control circuit 20 generates the same voltage as the data write, and then, outputs it to the word line driver 13. A row sector is selected by the same method as the data write and read, and then, the selected sector is activated by a high voltage.

The data latch circuit 120 activates a bit line designated by the column address from the column decoder, and then, erases a data stored in the corresponding memory cell.

According to the present invention, in the non-volatile semiconductor memory device 100, the following construction is employed; more specifically, the defective sector and the alternate non-defective sector are replaced with each other in one-to-one correspondence. Therefore, in the case where write, read and erase of data are executed using a block comprising a predetermined number of row sectors as a management unit, it is possible to greatly reduce a defective rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device which executes data writing, reading and erasing using a block including a plurality of sectors having a plurality of memory cells and being arranged in a row direction as a control unit, comprising:

a memory cell array having a data area including a plurality of said blocks;

a sector selecting circuit receiving a row address signal for designating each of a plurality of sectors included in said data area, selecting an alternate non-defective sector as an alternative to a defective sector when said row address signal designates the defective sector, and selecting said defective sector corresponding to said alternate non-defective sector when said row address signal designates said alternate non-defective sector; and a sector activation circuit for activating a sector selected by said sector selecting circuit, and for activating a sector which is made non-selective by said sector selecting circuit, said alternate non-defective sector being provided in at least one block in accordance with the number of said defective sectors.

2. The non-volatile semiconductor memory device according to claim 1, wherein said sector selecting circuit selects the defective sector by making all of said plurality of sectors non-selective when said address signal designates said alternate non-defective sector.

3. The non-volatile semiconductor memory device according to claim 1, wherein said data area includes a redundant area having at least one block provided with said alternate non-defective sector.

4. The non-volatile semiconductor memory device according to claim 2, wherein said sector selecting circuit includes:

a row decoder for decoding said row address signal, and for outputting the decoded row address to said sector activation circuit; and a redundant circuit for outputting a relief signal for making said defective sector non-selective when said row address signal designates said defective sector to said row decoder, for outputting an activation signal for activating said alternate non-defective sector to said sector activation circuit, and for outputting an non-selecting signal for making said plurality of sectors non-selective when said row address signal designates said alternate non-defective sector to said row decoder.

5. The non-volatile semiconductor memory device according to claim 4, wherein said row decoder comprises a plurality of first logic elements corresponding to said plurality of sectors included in said data area, and operating a logical product of said row address signal and said relief signal, and said sector activation circuit comprises:

at least one second logic element corresponding to the alternate non-defective sector included in said redundant area, and operating a logical product of an output signal from said first logic elements and said activation signal; and a plurality of third logic elements corresponding to said plurality of sectors included in said data area except said redundant area, and inverting the output signal from said first logic element.

6. The non-volatile semiconductor memory device according to claim 4, wherein said redundant circuit includes a programmable read only memory which stores a redundant information which indicates that an alternate non-defective sector as an alternative to a defective sector in the data area except said redundant area is maintained in said redundant area.

7. The non-volatile semiconductor memory device according to claim 6, wherein said programmable read only memory stores said redundant information by a fuse.

* * * * *